United States Patent
Ries et al.

(10) Patent No.: US 8,845,859 B2
(45) Date of Patent: Sep. 30, 2014

(54) SYSTEMS AND METHODS FOR CLEAVING A BONDED WAFER PAIR

(75) Inventors: Michael John Ries, St. Charles, MO (US); Jeffrey L. Libbert, O'Fallon, MO (US); Dale A. Witte, O'Fallon, MO (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 260 days.

(21) Appl. No.: 13/417,934

(22) Filed: Mar. 12, 2012

(65) Prior Publication Data

US 2013/0062020 A1    Mar. 14, 2013

Related U.S. Application Data

(60) Provisional application No. 61/498,915, filed on Jun. 20, 2011, provisional application No. 61/452,682, filed on Mar. 15, 2011.

(51) Int. Cl.
*B32B 38/10* (2006.01)
*H01L 21/762* (2006.01)
*H01L 21/67* (2006.01)

(52) U.S. Cl.
CPC ........ *H01L 21/76254* (2013.01); *B23B 43/006* (2013.01); *H01L 21/67092* (2013.01); *C09J 2205/302* (2013.01); *Y10S 156/93* (2013.01); *Y10S 156/941* (2013.01)
USPC ........... 156/717; 156/714; 156/715; 156/759; 156/760; 156/764; 156/930; 156/941

(58) Field of Classification Search
USPC ......... 156/714, 930, 941, 715, 717, 759, 760, 156/764, 295, 443, 580
See application file for complete search history.

(56) References Cited

U.S. PATENT DOCUMENTS

| | | | |
|---|---|---|---|
| 6,221,740 B1 | 4/2001 | Bryan et al. | |
| 6,263,941 B1 | 7/2001 | Bryan et al. | |
| 6,391,740 B1 | 5/2002 | Cheung et al. | |
| 6,513,564 B2 | 2/2003 | Bryan et al. | |
| 7,510,948 B2 | 3/2009 | Morimoto et al. | |
| 7,740,735 B2* | 6/2010 | Kerdiles et al. | 156/707 |
| 8,360,129 B2* | 1/2013 | Ebata et al. | 156/764 |
| 2002/0023725 A1 | 2/2002 | Bryan et al. | |
| 2005/0150597 A1* | 7/2005 | Henley et al. | 156/344 |
| 2006/0166472 A1 | 7/2006 | Henley et al. | |
| 2008/0305721 A1* | 12/2008 | Ohashi et al. | 451/41 |
| 2011/0253314 A1* | 10/2011 | George | 156/706 |

FOREIGN PATENT DOCUMENTS

WO    WO 2011024689 A1 *  3/2011

\* cited by examiner

*Primary Examiner* — Mark A Osele
(74) *Attorney, Agent, or Firm* — Armstrong Teasdale LLP (57) ABSTRACT

Systems and methods are provided for mechanically cleaving a bonded wafer pair by controlling the rate of cleaving. This controlled rate of cleaving results in a reduction or elimination of non-uniform thickness variations in the cleaved surface of the resulting SOI wafer. One embodiment uses flexible chucks attached to the faces of the wafers and actuators attached to the flexible chucks to cleave the bonded wafer pair. Other embodiments also use rollers in contact with the surfaces to control the rate of cleaving.

21 Claims, 12 Drawing Sheets

SYSTEMS AND METHODS FOR CLEAVING A BONDED WAFER PAIR

CROSS REFERENCES

This application claims priority to U.S. Provisional 61/498,915 filed on Jun. 20, 2011 and Provisional Application 61/452,682 filed on Mar. 15, 2011, both of which are incorporated herein by reference.

FIELD

This invention generally relates to systems and methods for cleaving a bonded wafer pair and, more specifically, to controlling the rate of cleaving the bonded wafer pair with a flexible chuck and an actuator.

BACKGROUND

Semiconductor wafers are generally prepared from a single crystal ingot (e.g., a silicon ingot) which is sliced into individual wafers. While reference will be made herein to semiconductor wafers constructed from silicon, other materials may be used as well, such as germanium or gallium arsenide.

One type of wafer is a silicon-on-insulator (SOI) wafer. An SOI wafer includes a thin layer of silicon atop an insulating layer (i.e., an oxide layer), which is in turn disposed on a silicon substrate. A silicon-on-insulator wafer is a type of silicon-on-insulator structure.

An example process of making an SOI wafer includes depositing a layer of oxide on a polished front surface of a donor wafer. Particles (e.g., hydrogen atoms or a combination of hydrogen and helium atoms) are implanted at a specified depth beneath the front surface of the donor wafer. The implanted particles form a cleave plane in the donor wafer at the specified depth at which they were implanted. The surface of the donor wafer is cleaned to remove organic compounds deposited on the wafer during the implantation process.

The front surface of the donor wafer is then bonded to a handle wafer to form a bonded wafer through a hydrophilic bonding process. The donor wafer and handle wafer are bonded together by exposing the surfaces of the wafers to plasma containing, for example, oxygen or nitrogen. Exposure to the plasma modifies the structure of the surfaces in a process often referred to as surface activation. The wafers are then pressed together and a bond is formed therebetween. This bond is relatively weak, and must be strengthened before further processing can occur.

In some processes, the hydrophilic bond between the donor wafer and handle wafer (i.e., a bonded wafer pair) is strengthened by heating or annealing the bonded wafer pair at temperatures between approximately 300° C. and 500° C. The elevated temperatures cause the formation of covalent bonds between the adjoining surfaces of the donor wafer and the handle wafer, thus solidifying the bond between the donor wafer and the handle wafer. Concurrently with the heating or annealing of the bonded wafer, the particles earlier implanted in the donor wafer weaken the cleave plane. A portion of the donor wafer is then separated (i.e., cleaved) along the cleave plane from the bonded wafer to form the SOI wafer.

The bonded wafer is first placed in a fixture in which mechanical force is applied perpendicular to the opposing sides of the bonded wafer in order to pull a portion of the donor wafer apart from the bonded wafer. According to some methods, suction cups are utilized to apply the mechanical force. The separation of the portion of the donor wafer is initiated by applying a mechanical wedge with a knife blade or similar structure at the edge of the bonded wafer at the interface between the donor wafer and the handle wafer. The application of the mechanical force initiates propagation of a cleave along the cleave plane. The mechanical force applied by the suction cups then pulls a portion of the donor wafer away from the bonded wafer, thus forming an SOI wafer.

The resulting SOI wafer thus comprises a thin layer of silicon disposed atop the oxide layer and the handle wafer. The thickness of the layer may be non-uniform. The layer may also have a non-uniform roughness. This non-uniform thickness and roughness of the layer may be the result of the cleave propagating at varying speeds and/or the mechanical force applied by the suction cups. Additional processing is thus required to reduce the variation in thickness of the layer and/or smooth this layer. These additional processing steps are both time-consuming and costly.

Thus, there remains a need for a system and method for cleaving a bonded wafer pair that results in the SOI wafer having a layer with a relatively uniform thickness and roughness.

This Background section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF SUMMARY

One aspect is a system for cleaving a bonded wafer pair having a first face and a second face. The system comprises a flexible chuck for attachment to the first face of the wafer pair and an actuator attached to the flexible chuck for application of force on the flexible chuck. The application of force on the flexible chuck causes the cleaving of the bonded wafer pair.

Another aspect is a system for cleaving a bonded wafer pair having a first face and a second face. The system comprises a flexible chuck for attachment to the first face of the wafer pair, an actuator for attachment to the flexible chuck, and a movable roller positionable adjacent the actuator for application of force on the flexible chuck and movable along the flexible chuck. The position of the roller controls the propagation of the cleave of the bonded wafer pair Another aspect is a system for cleaving a bonded wafer pair having a first face and a second face. The system comprises a first flexible chuck for attachment to the first face of the wafer pair, a second flexible chuck for attachment to the second face of the wafer pair, a first vacuum attachment for to the first flexible chuck, a second vacuum attachment for attachment to the second flexible chuck, a movable first roller positionable adjacent the first vacuum attachment for application of force on the first flexible chuck and movable along the first flexible chuck, and a movable second roller positionable adjacent the second vacuum attachment for application of force on the second flexible chuck and movable along the second flexible chuck. The position of the first and second rollers controls the propagation of the cleave of the wafer pair.

Still another aspect is a method of cleaving a bonded wafer pair having a first face a second face. The method comprises attaching a flexible chuck to the first of the wafer pair, attaching an actuator to the flexible chuck, and applying force on the flexible chuck and the first face of the wafer with actuator to separate layers of the bonded wafer pair and cleave the bonded wafer pair.

Various refinements exist of the features noted in relation to the above-mentioned aspects. Further features may also be incorporated in the above-mentioned aspects as well. These refinements and additional features may exist individually or in any combination. For instance, various features discussed below in relation to any of the illustrated embodiments may be incorporated into any of the above-described aspects, alone or in any combination.

BRIEF DESCRIPTION OF THE DRAWINGS

Like reference symbols in the various drawings indicate like elements.

DETAILED DESCRIPTION

The embodiments described herein generally relate to systems and methods for mechanically cleaving a bonded wafer pair. The systems and methods cleave (i.e., separate) a portion of a donor wafer along a cleave plane from the bonded wafer pair to form a silicon-on-insulator (SOI) wafer. While reference is made herein to use of the systems and methods in cleaving silicon-on-insulator structures, the systems and methods can also be used to cleave or separate layers in other structures.

FIGS. 1-5 depict a system 100 for mechanically cleaving a bonded wafer pair 102 along a cleave plane 140 shown in phantom. The bonded wafer pair 102 has an upper surface 106 (generally, a first surface or a first face) and an opposing lower surface 108 (generally, a second surface or a second face). The bonded wafer pair has an handle wafer 110 (generally, a first layer) bonded to a donor wafer 112 (generally, a second layer) along a bond interface 104. A depression 144 is formed in the bonded wafer pair 102 at the bond interface 104 at the edge of the wafer pair 102. The lower surface 108 of the bonded wafer 102 is connected to a fixed structure 128 that prevents movement of the lower surface.

The distance between the cleave plane 140 in the donor wafer 112 and the bond interface 104 is greatly exaggerated for the sake of clarity. Furthermore, in other embodiments, the position of the handle wafer 110 and the donor wafer 112 is reversed such that the handle wafer is disposed beneath the donor wafer.

In this embodiment, a chuck 120 is attached adjacent a leading edge 122 thereof to the upper surface 106 of the bonded wafer 102 at an attachment point 124 on the bonded wafer. The chuck 120 has a pocket 148 (shown in FIG. 3B with the bonded wafer pair omitted) that receives the bonded wafer 102. In this embodiment, a fastening system 126 (e.g., adhesive, wax, or any other suitable fastener) is used to connect the chuck 120 at the leading edge 122 of the chuck to the attachment point 124.

Figure 3A:
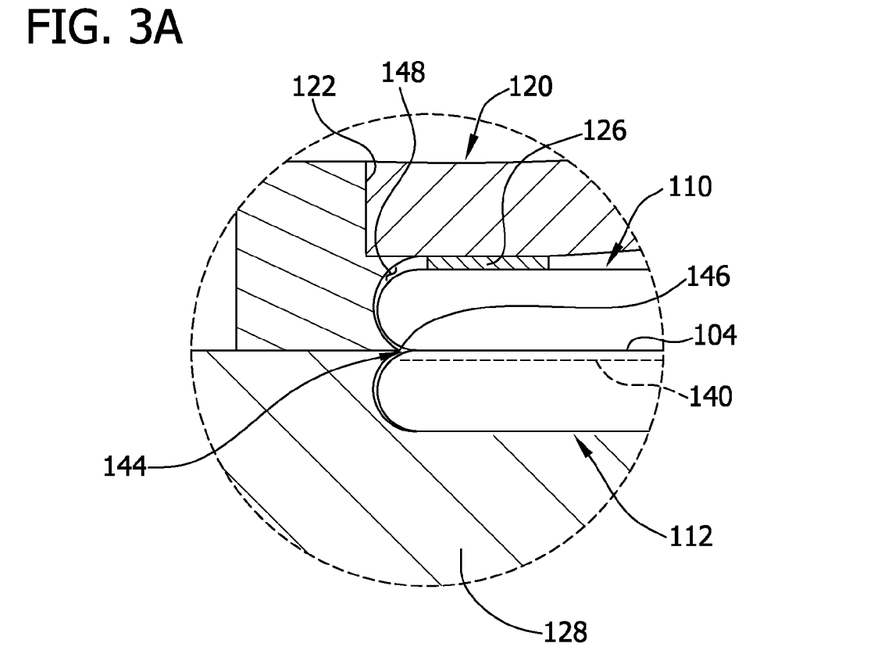
FIG. 3A is an enlarged portion of FIG. 2.
Figure 3B:
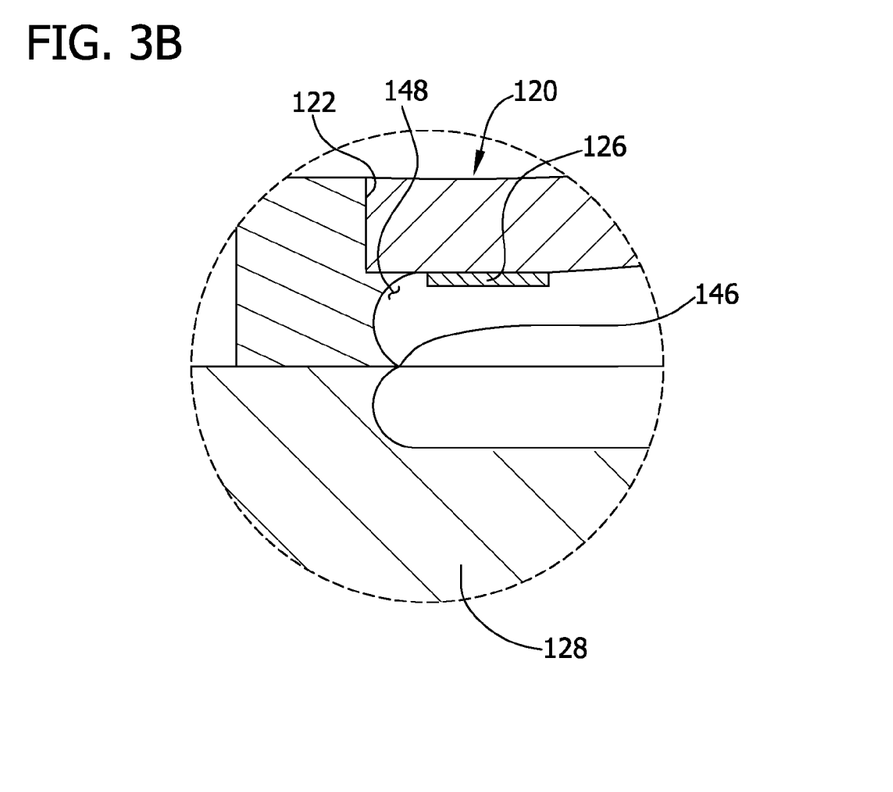
FIG. 3B is an enlarged portion of FIG. 2 with bonded wafer pair omitted.

In other embodiments, the fastening system 126 may not be used to connect the chuck 120 to the upper surface 106. Instead, as shown in FIG. 3A, a front portion 142 of the chuck 120 has a protrusion 146 that has a complementary shape to and engages the depression 144 in the bonded wafer pair 102. Moreover, the fastening system 126 may be used in embodiments using the protrusion 146 to engage the depression 144 in the bonded wafer pair 102.

The chuck 120 is constructed from a material (e.g., plastic, steel, or alloys thereof) which restricts the chuck from bending significantly during use such that the chuck is a rigid structure. In some embodiments, the chuck 120 is constructed from a porous material such that vacuum is used to connect the chuck to the upper surface 110 of the bonded wafer 102. This vacuum may be used in addition to or in place of the fastening system 126.

The chuck 120 has a curved profile and is connected to a suitable mechanism (omitted for clarity) capable of rotating the chuck. In the embodiment of FIGS. 1-5, the chuck 120 is connected to an actuator 170 (FIG. 2) capable of rotating the chuck 120 in a clockwise direction as viewed from the perspective of the Figures. This clockwise rotation of the chuck 120 during use of the system 100 results in the cleaving of the bonded wafer pair 102.

While a single chuck 120 is shown in FIGS. 1-5, in other embodiments a similar chuck is connected to the lower surface 108 of the donor wafer 112, instead of the fixed structure 128. The two chucks can be used to cleave the bonded wafer pair 102. Alternatively, the upper surface 106 of the bonded wafer pair 102 may be connected to a fixed structure and the lower surface 108 is connected to a chuck.

Figure 1:
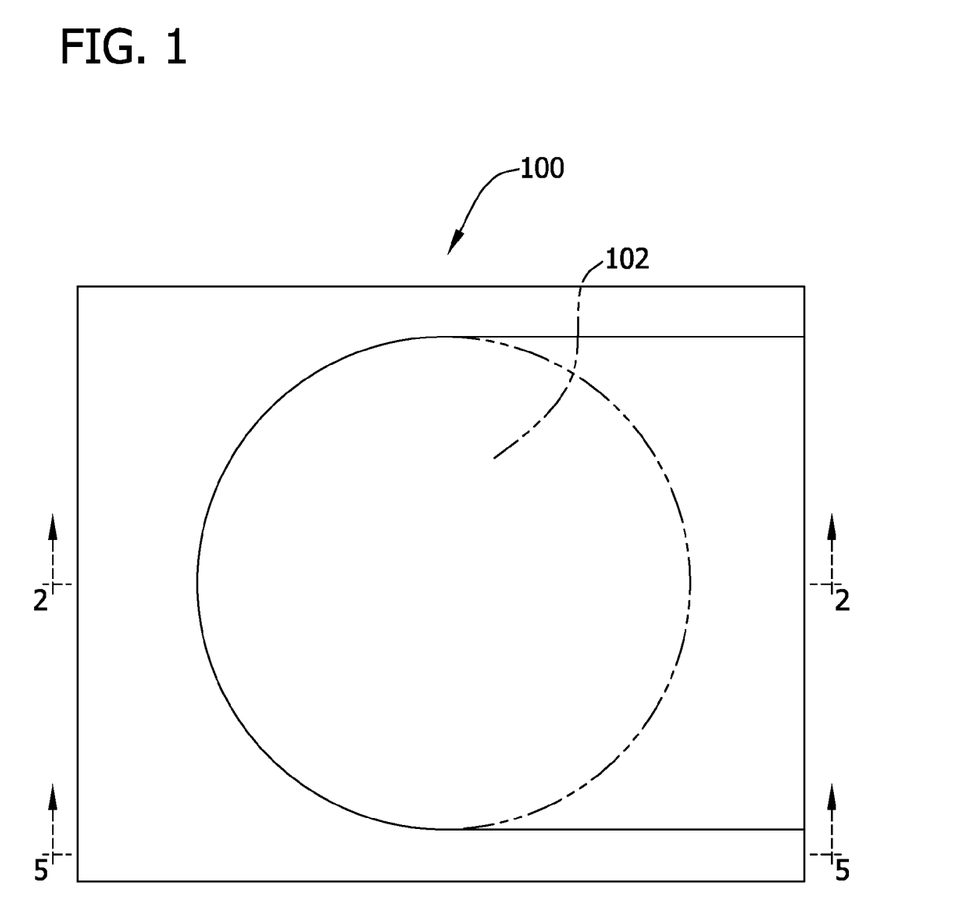
FIG. 1 is a top view of a system for cleaving a bonded wafer pair.
Figure 2:
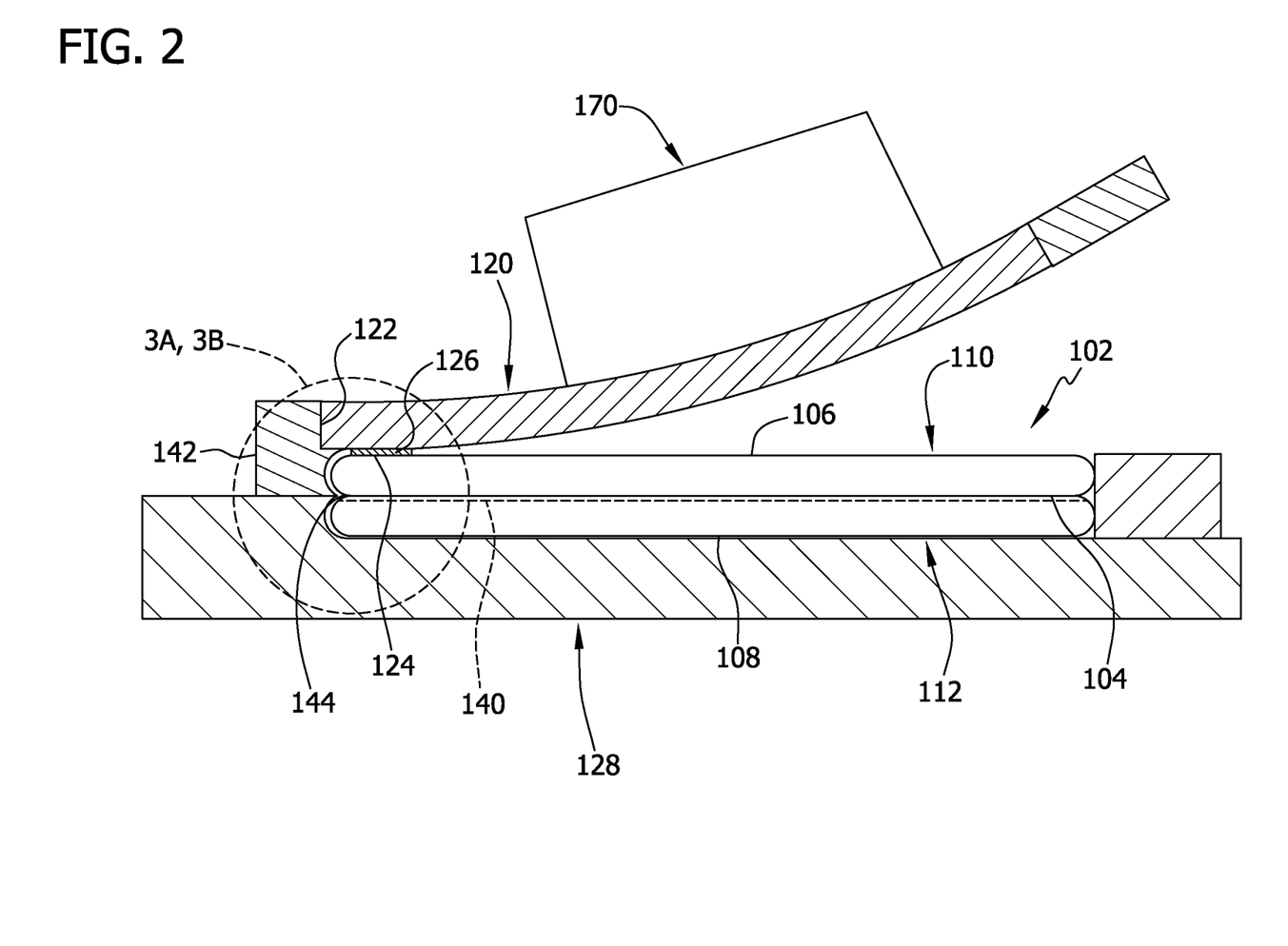
FIG. 2 is a cross-sectional view of FIG. 1 taken along the 2-2 line showing the system prior to cleaving the bonded wafer pair.
Figure 4:
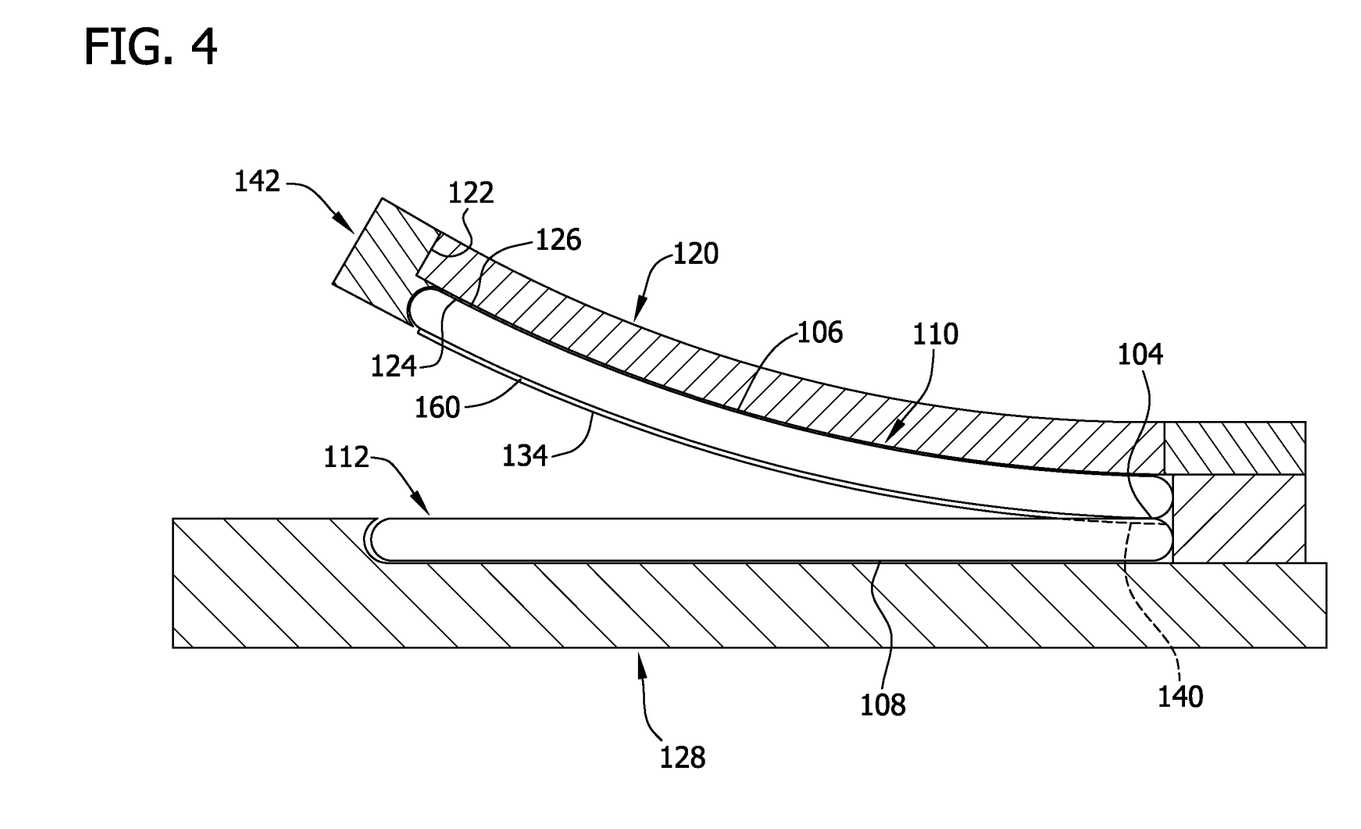
FIG. 4 is a cross-sectional view similar to FIG. 2 showing the system during cleaving of the bonded wafer pair.
Figure 5:
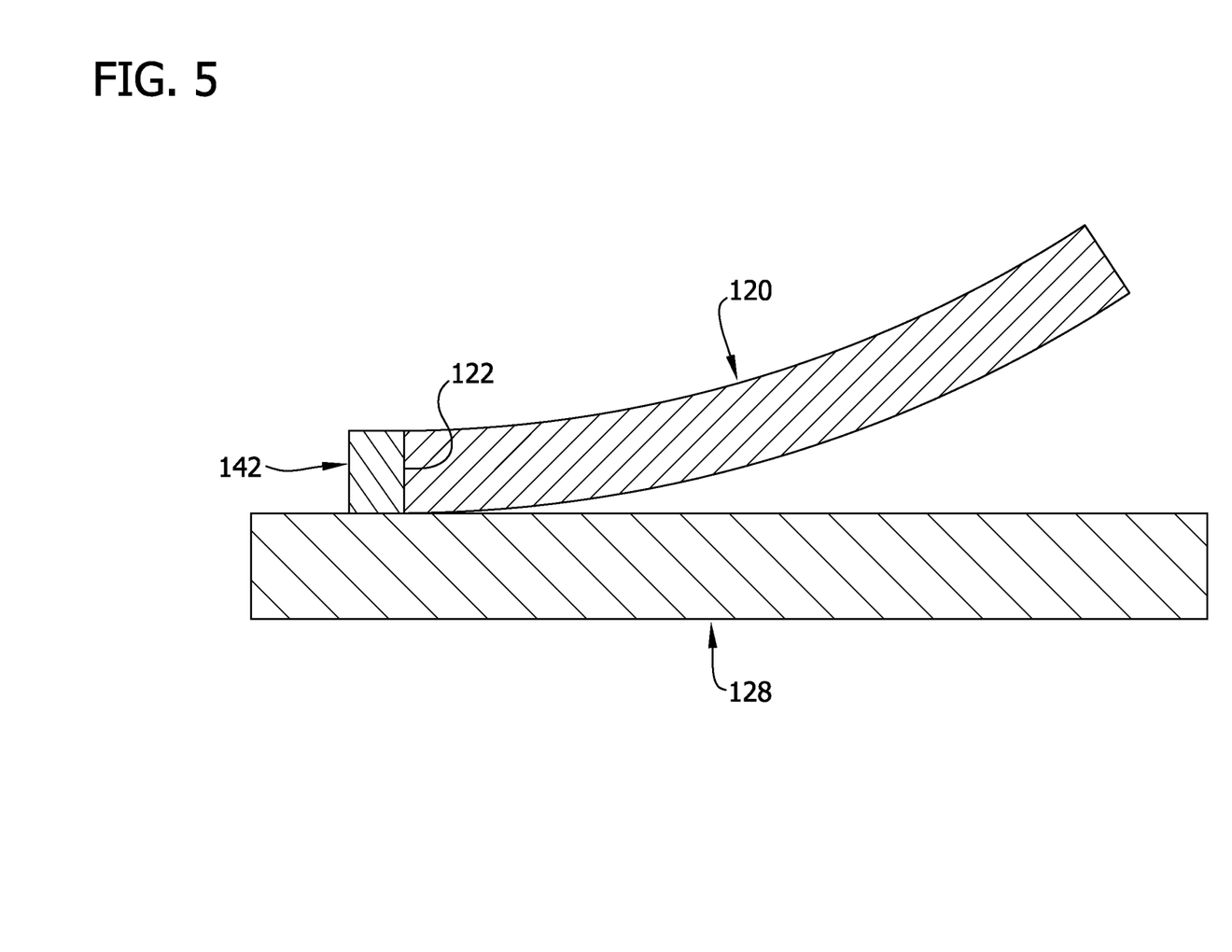
FIG. 5 is a cross-sectional view of FIG. 1 taken along the 5-5 line showing the system in an initial state prior to cleaving the bonded wafer pair.

In operation, the chuck 120 is connected adjacent its leading edge 122 to the upper surface 106 of the handle wafer 110 at the attachment point 124. This position of the system 100 is shown in FIG. 2. The chuck 120 is then rotated in a clockwise direction (as shown in the perspective of FIGS. 1-2) by the actuator 170 to initiate cleaving of the bonded wafer pair 102. Concurrently with initiation of the cleaving, the bonded wafer pair 102 begins to separate or cleave along the cleave plane 140. In some embodiments, a blade may be used to exert mechanical force at the edge of the bonded wafer pair 102 at the depression 144. As the chuck 120 rotates, an upward force is applied by the chuck to the upper surface 106 at the attachment point 124. This upward force pulls the layers 110, 112 of the bonded wafer 102 apart along the cleave plane 140, as shown in FIG. 4. Cleaving causes a layer 160 (FIG. 4) of silicon to be transferred from the donor wafer 112 to the handle wafer 110, resulting in the creation of an SOI wafer.

Figure 6:
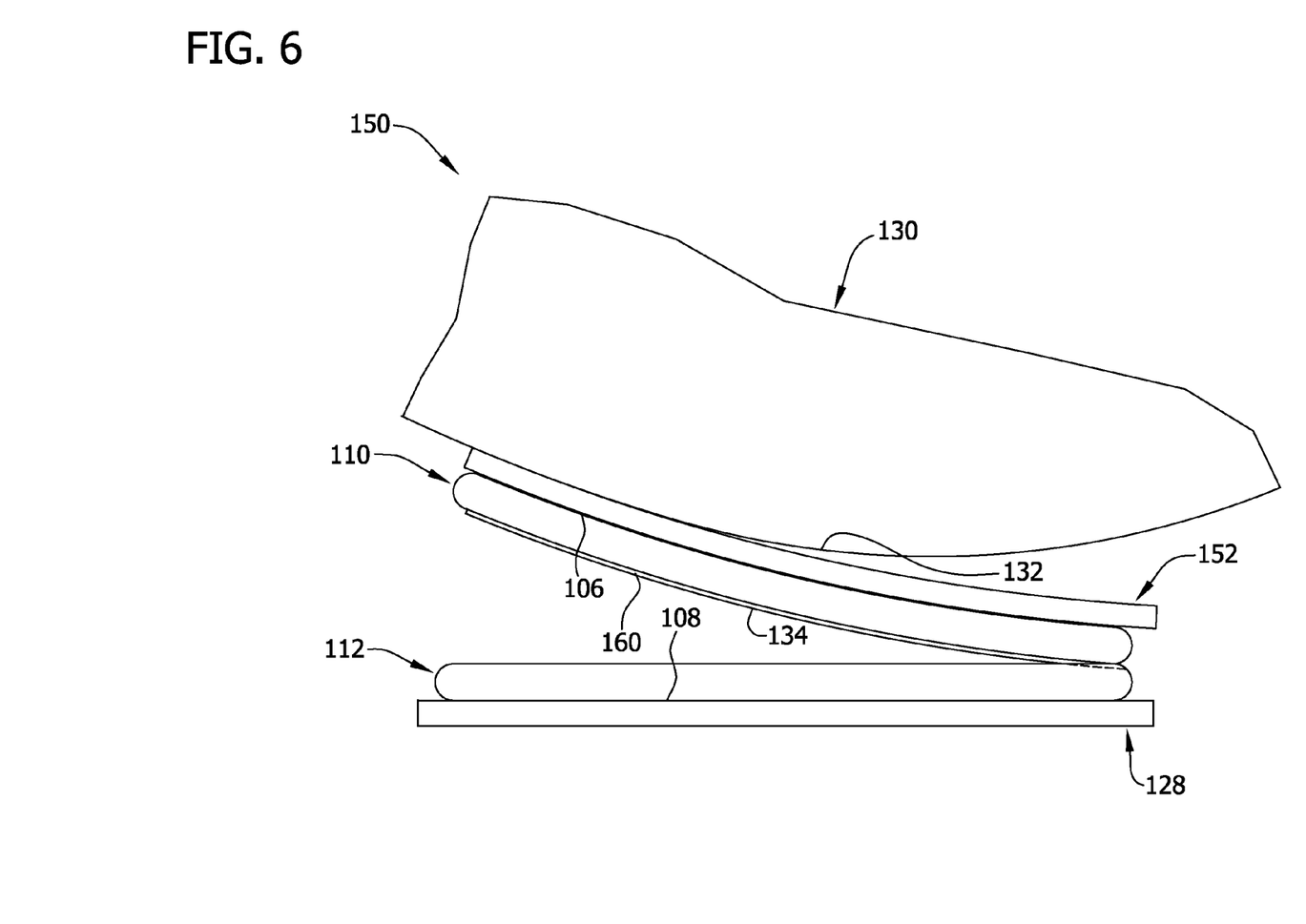
FIG. 6 is a side view of another system for cleaving a bonded wafer pair.

FIG. 6 depicts another system 150 for cleaving the bonded wafer pair 102. The bonded wafer pair 102 is the same as, or similar to, the bonded wafer pair described above. As such, like reference numerals are used to refer to like features on the bonded wafer pair 102 in FIG. 6.

The system 150 includes a rotatable chuck 130 having a profile 132 that is at least partially curved. A flexible chuck 152 is connected to the rotatable member. The flexible chuck 152 is formed from any suitable compliant, resilient material (e.g., plastic) which allows the chuck to bend during use. In some embodiments, the flexible chuck 152 is constructed from a porous material such that vacuum is used to connect the flexible chuck to the upper surface 110 of the bonded wafer pair 102.

Any suitable fastening system can be used to connect the flexible chuck 152 to the rotatable member 130 (e.g., adhesive, wax, mechanical fasteners, and/or vacuum). The rotatable member 130 is a rigid structure that does not deflect significantly during use of the system 100. For example, the rotatable member 130 may be constructed from steel or alloys thereof.

The rotatable member 130 is connected to a suitable mechanism (e.g., an actuator similar to or the same as actuator 170 described above) for rotating the member. In the cross-sectional view of FIG. 6, the drive source rotates the rotatable member 130 in a clockwise direction during use of the system 200 to cleave the bonded wafer pair 102.

While a single flexible chuck 152 and rotatable member 130 are shown in FIG. 6, in other embodiments a similar flexible chuck is connected to the lower surface 108 of the donor wafer 112, instead of the fixed structure 128. Another rotatable member is in turn connected to this flexible chuck. The two flexible chucks and rotatable members can be used in conjunction to cleave the bonded wafer pair 102. Alternatively, the upper surface 106 of the bonded wafer pair 102 can be connected to a fixed structure and only the lower surface 108 is connected to a flexible chuck and rotatable member.

In operation, the flexible chuck 152 is connected adjacent its leading edge 122 to the upper surface 106 of the handle wafer 110 at the attachment point 124. The rotatable member 130 is then rotated in a clockwise direction (as shown in the perspective of FIG. 6) to initiate cleaving of the bonded wafer pair 102. Concurrently with initiation of the cleaving, the bonded wafer pair 102 begins to separate or cleave along the cleave plane 140. In some embodiments, a blade could be used to exert mechanical force at the edge of the bonded wafer pair 102 at the depression 144. As the rotatable member 130 rotates, an upward force is applied by the flexible chuck 152 to the upper surface 106 at the attachment point 124. This upward force pulls the layers 110, 112 of the bonded wafer 102 apart along the cleave plane 140. Cleaving causes the layer 160 (FIG. 6) of silicon to be transferred from the donor wafer 112 to the handle wafer 110, resulting in the creation of an SOI wafer.

In the embodiments of the system 100 and system 150, the rotation of the chuck 120 and rotatable member 130 controls the rate of propagation of the cleave along the cleave plane 140. This rate can be altered by adjusting the rate of rotation of the chuck 120 or rotatable member 130 and/or the profile of the chuck 120 or rotatable member 130. Moreover, the chuck 120 or rotatable member 130 can be rotated at a constant rate and as such the cleave propagates along the cleave plane 140 at a constant rate. This constant rate of cleave propagation significantly reduces or eliminates non-uniform thickness variations in the layer 160 (FIGS. 4 and 6) in a resulting SOI wafer.

Without being held to any particular theory, it is believed that non-uniform thickness and/or roughness variations in the layers 160 of wafers produced according to previous systems were caused by a non-constant rate of propagation of the cleave. The embodiments described herein reduce or eliminate this problem by controlling the rate of propagation and thereby reducing or eliminating thickness and/or roughness variations on the layer 160. These embodiments also enable control of the rate of propagation of the cleave along the cleave plane 140 so that the thickness and/or roughness of the layer 160 may be manipulated.

Figure 7:
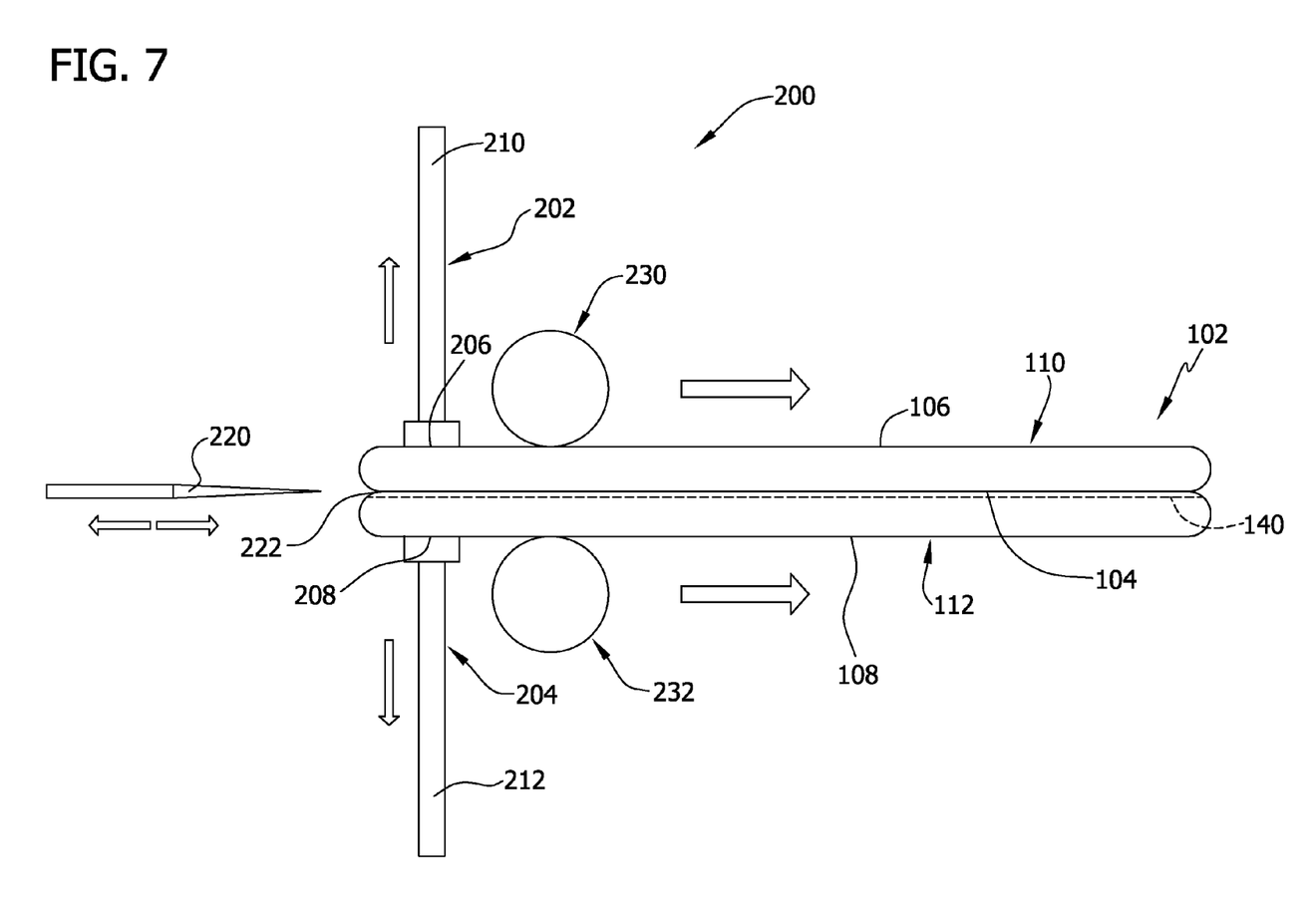
FIG. 7 is a side view of still another system for cleaving a bonded wafer pair in an initial state prior to cleaving the bonded wafer pair.
Figure 8:
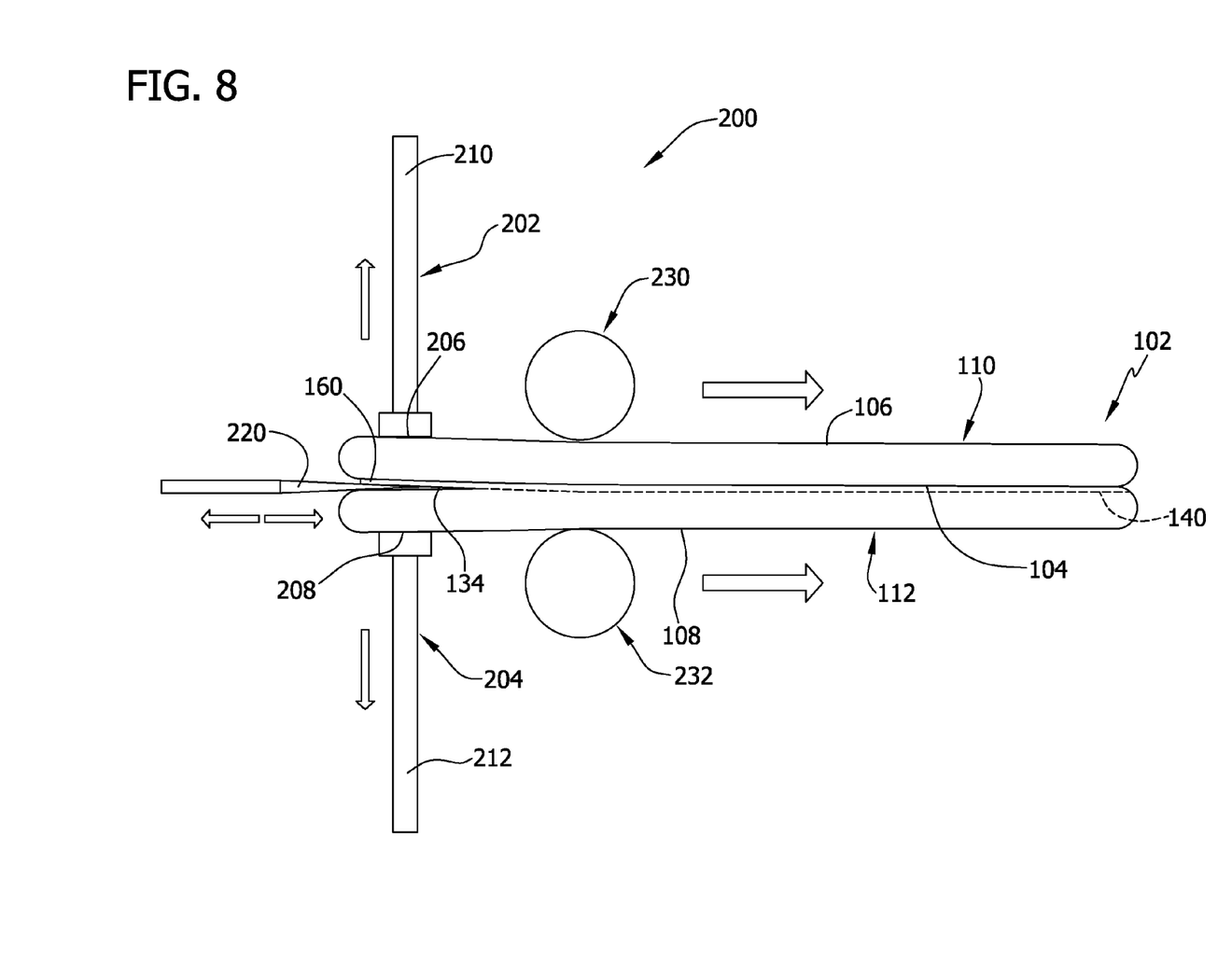
FIG. 8 is a side view of the system of FIG. 7 showing the system after the bonded wafer pair has been cleaved.

FIGS. 7 and 8 depict a system 200 for mechanically cleaving a bonded wafer pair 102. The bonded wafer pair 102 has features the same as, or similar to, the bonded wafer pair described above. As such, like reference numerals are used to refer to like features on the bonded wafer pair 102 in FIGS. 7 and 8.

An upper vacuum attachment 202 (generally, a first vacuum attachment) is provided for attachment to the upper surface 106 of the bonded wafer pair 102. A lower vacuum attachment 204 (generally, a second vacuum attachment) is provided for attachment to the lower surface 108 of the bonded wafer pair 102. A source of vacuum (not shown) is provided to the vacuum attachments 202, 204 to attach them to the respective surfaces 106, 108. Surfaces 206, 208 of the vacuum attachments 202, 204 in contact with the respective surfaces 106, 108 of the bonded wafer pair 102 are porous to allow gas to flow through the attachments. In other embodiments, any suitable fastening mechanism (e.g., adhesive) can be used instead of or in addition to vacuum to connect the vacuum attachments 202, 204 to the surfaces 106, 108 of the bonded wafer 102.

The vacuum attachments 202, 204 are connected to respective actuators 210, 212 or other mechanisms capable of exerting force on the vacuum attachments and moving the attachments. The actuators 210, 212 exert force on the attachments 202, 204 and move them in a direction away from the respective surfaces 106, 108 of the bonded wafer 102 to which they are attached.

A blade 220 is provided for initiating a cleaving process to separate the layers 110, 112 of the bonded wafer pair 102. The blade 220 is movable in a lateral direction by an actuator (not shown) or other suitable mechanism and exerts force on an edge 222 of the bonded wafer pair 102 at the bond interface 104. The force results in the initiation of a cleave along the cleave plane 140. This cleave results in the cleaving and separation of the layers 110, 112 of the bonded wafer pair 102 as the cleave propagates along the cleave plane 140. Note that the blade 220 is many times thicker than the cleave plane 140 and/or layers 110, 112 of the bonded wafer pair 102 in the exemplary embodiment. The thickness of the layers 110, 112 of the bonded wafer pair 102 and the layer 160 in the Figures are greatly exaggerated for clarity.

An upper roller 230 (generally, a first roller) is positioned adjacent and laterally to the right of the upper vacuum attachment 202, as shown in FIGS. 7 and 8. A lower roller 232 (generally, a second roller) is positioned adjacent and laterally to the right of the lower vacuum attachment 204. The rollers 230, 232 are in physical contact with and exert force on the respective surfaces 106, 108 of the layers 110, 112. The rollers 230, 232 are in turn connected to actuators (not shown) or other suitable mechanisms to move the rollers laterally along the respective surfaces 106, 108.

The rollers 230, 232 are suitably constructed from any material that is resistant to deformation. Moreover, the rollers 230, 232 may be coated with a material that prevents the rollers from abrading or contaminating the surfaces 106, 108, such as polytetrafluoroethylene (PTFE).

In operation, the vacuum attachments 202, 204 are connected to the respective surfaces 106, 108 of the bonded wafer 102 and are operable to exert upward or downward forces, respectively, on the surfaces of the wafer to which they are attached. The rollers 230, 232 are positioned adjacent the vacuum attachments 202, 204, although the rollers may be laterally spaced from the attachments.

The blade 220 is then brought into contact with the edge 222 of the bonded wafer pair 102 at the bond interface 104. The blade 220 is moved laterally (to the right in FIGS. 7 and 8) with the actuator or other suitable mechanism to initiate the cleaving process to separate the layers 110, 112 of the bonded wafer pair 102.

As the blade 220 is moved laterally to the right, the rollers 230, 232 are likewise moved laterally to the right and the vacuum attachments 202, 204 pull the layers 110, 112 apart. The position of the rollers 230, 232 with respect to the surfaces 106, 108 controls the propagation of the cleave along the cleave plane 140 in the bonded wafer pair 102. As shown in FIGS. 7 and 8, the rollers 230, 232 prevent the cleave from propagating between the rollers and to the right of the rollers. When the rollers 230, 232 move to the right, the cleave can continue to propagate. The rollers 230, 232 continue to be moved laterally to the right and the cleave continues to propagate until the entire handle wafer 110 has been cleaved from the donor wafer 112. Cleaving causes the layer 160 of silicon to be transferred from the donor wafer 112 to the handle wafer 110, resulting in the creation of an SOI wafer.

Like the systems 100, 150 described above, the system 200 permits the control of the rate of propagation of the cleave along the cleave plane 140. In the system 200, the lateral movement of the rollers 230, 232 controls the rate of propagation of the cleave along the cleave plane 140. The rate can thus be altered by adjusting the rate of movement of the rollers 230, 232. Moreover, the rollers 230, 232 can be moved at a constant rate and as such the cleave propagates along the cleave plane 140 at a constant rate. This constant rate of cleave propagation significantly reduces or eliminates non-uniform thickness and/or roughness variations in the layer 160 of the resulting SOI wafer.

Without being bound to any particular theory, it is believed that a non-constant rate of propagation of the cleave in prior art systems caused non-uniform thickness and/or roughness variations in the transferred layers of SOI wafers. The embodiments described above reduce or eliminate this cause of non-uniform thickness and/or roughness variations on the layer 160. These embodiments also enable better control of the rate of propagation of the cleave along the cleave plane 140 so that the thickness and/or roughness of the layer 160 may be manipulated.

Figure 9:
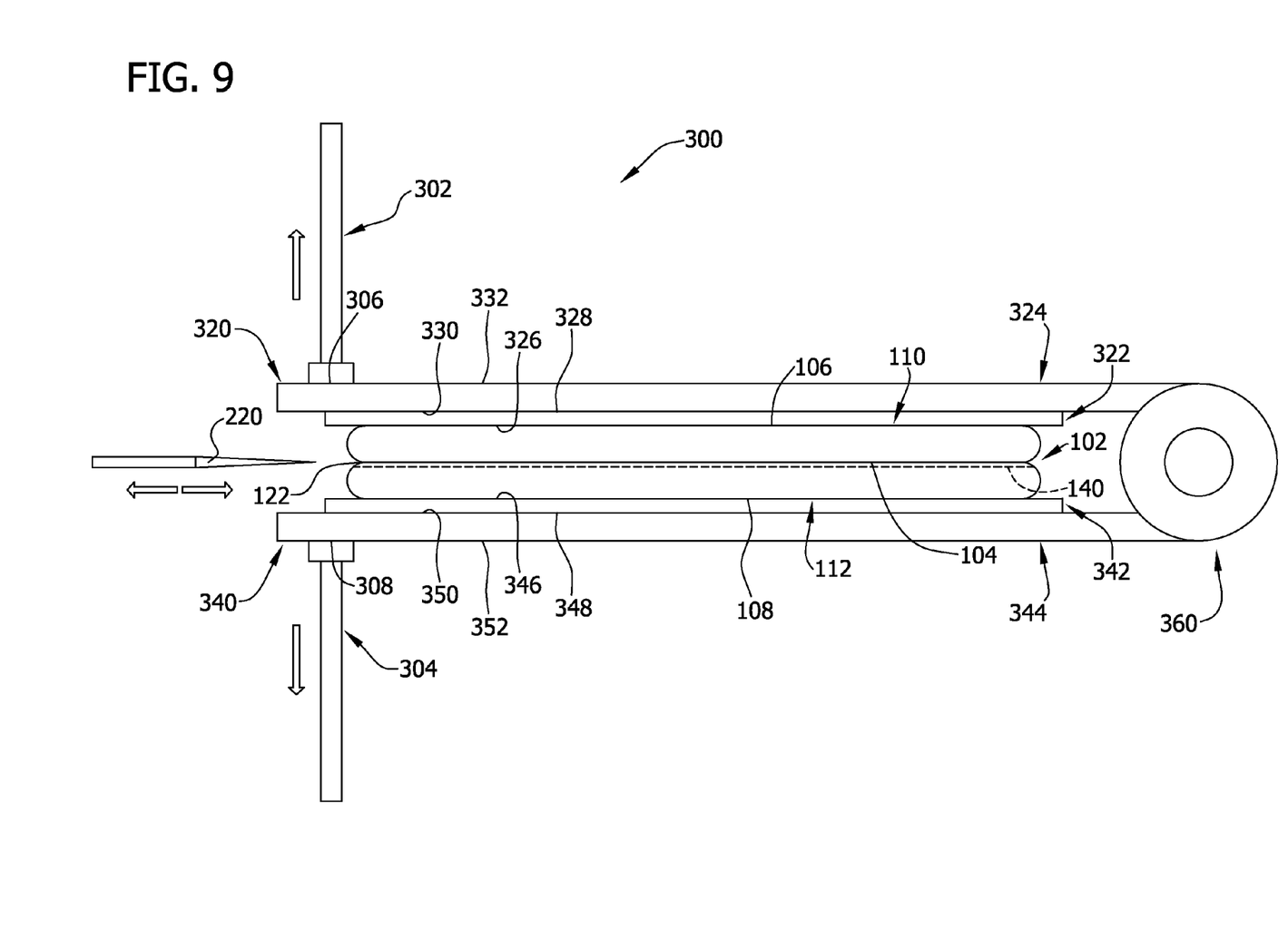
FIG. 9 is a side view of yet another system for cleaving a bonded wafer pair in an initial state prior to cleaving the bonded wafer pair.
Figure 10:
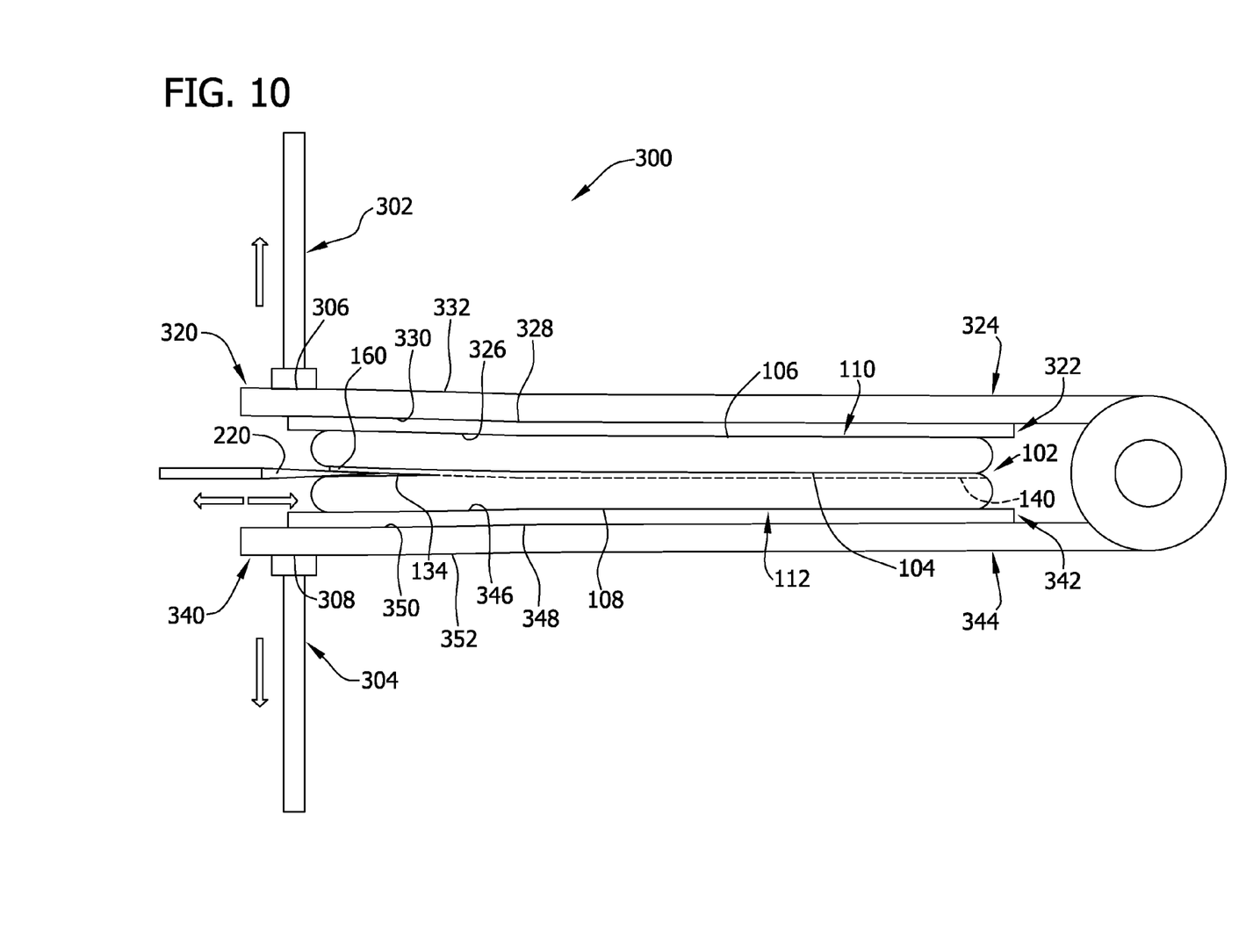
FIG. 10 is a side view of the system of FIG. 9 showing the system after the bonded wafer pair has been cleaved.

FIGS. 9 and 10 depict a system 300 for mechanically cleaving the bonded wafer pair 102. The bonded wafer pair 102 has features the same as, or similar to, the bonded wafer pairs described above. As such, like reference numerals are used to refer to like features on the bonded wafer pair 102 in FIGS. 9 and 10.

An upper flexible chuck 320 (generally, a first flexible chuck) is provided for attachment to the upper surface 106 of the bonded wafer pair 102. The upper flexible chuck 320 includes a flexible wafer support 322 and a flexible plate 324. The flexible wafer support 322 has a first surface 326 for attachment to the upper surface 106 of the bonded wafer pair 102 and an opposing second surface 328 for attachment to a first surface 330 of the flexible plate 324. The flexible plate 324 has a second surface 332 opposite the first surface.

A lower flexible chuck 340 (generally, a second flexible chuck) is provided for attachment to the lower surface 108 of the bonded wafer pair 102. The lower flexible chuck 340 also includes a flexible wafer support 342 and a flexible plate 344. The flexible wafer support 324 has a first surface 346 for attachment to the lower surface 108 of the bonded wafer pair 102 and an opposing second surface 348 for attachment to a first surface 350 of the flexible plate 344. The flexible plate 344 has a second surface 352 opposite the first surface 350.

The flexible wafer supports 322, 342 can be formed from any suitable material, such as a porous vacuum chuck, wax, or an adhesive. The flexible plates 324, 344 can be formed from any suitable flexible material, such as aluminum or plastic. The flexible wafer supports 322, 342 and the flexible plates 324, 344 are both at least as flexible as the layers 110, 112 of the bonded wafer pair 102. Moreover, the flexible wafer supports 322, 342 and the flexible plates 324, 344 may be more flexible than the layers 110, 112 in some embodiments. Moreover the flexible wafer supports 322, 342 and the flexible plates 324, 344 are bonded together with any suitable adhesive in the example embodiment.

The upper flexible chuck 320 and the lower flexible chuck 340 are connected by a hinge 360. In the example embodiment, the flexible plates 324, 344 are connected to the hinge 360. In other embodiments, the flexible wafer supports 322, 342 may be connected to the hinge 360 in addition to or in place of the flexible plates 324, 344. Moreover, the hinge 360 may be omitted without departing from the scope of the embodiments.

An upper actuator 302 (generally, a first actuator) is provided for attachment to the second surface 332 of the flexible plate 324. A lower actuator 304 (generally, a second actuator) is provided for attachment to the second surface 352 of the flexible plate 344. A source of vacuum (not shown) is provided to the actuators 302, 304 to attach them to the respective surfaces 332, 352. Surfaces 306, 308 of the actuators 302, 304 in contact with the respective surfaces 332, 352 of the flexible plates 324, 344 are porous to allow gas to flow through the actuators. In other embodiments, any suitable fastening mechanism (e.g., adhesive) can be used instead of or in addition to vacuum to connect the actuators 302, 304 to the surfaces 332, 352 of the flexible plates 324, 344.

The blade 220 is provided for initiating a cleaving process to separate the layers 110, 112 of the bonded wafer pair 102. The blade 220 is movable in a lateral direction by an actuator (not shown) or other suitable mechanism and exerts force on the edge 122 of the bonded wafer pair 102 at the bond interface 104. The force results in the initiation of a cleave along the cleave plane 140. This cleave results in the cleaving and separation of the layers 110, 112 of the bonded wafer pair 102 as the cleave propagates along the cleave plane 140.

In operation, the actuators 302, 304 are operable to exert upward or downward forces, respectively, on the surfaces 106, 108 of the wafer to which the respective flexible chucks 320, 340 are attached. The blade 220 is then brought into contact with the edge 122 of the bonded wafer pair 102 at the bond interface 104. The blade 220 is moved laterally (to the right in FIGS. 9 and 10) with the actuator or other suitable mechanism to initiate the cleaving process to separate the layers 110, 112 of the bonded wafer pair 102.

As the blade 220 is moved laterally to the right, the actuators 302, 304 pull the flexible chucks 320, 340 and respective layers 110, 112 apart. Cleaving causes the layer 160 of silicon to be transferred from the donor wafer 112 to the handle wafer 110, resulting in the creation of an SOI wafer.

Figure 11:
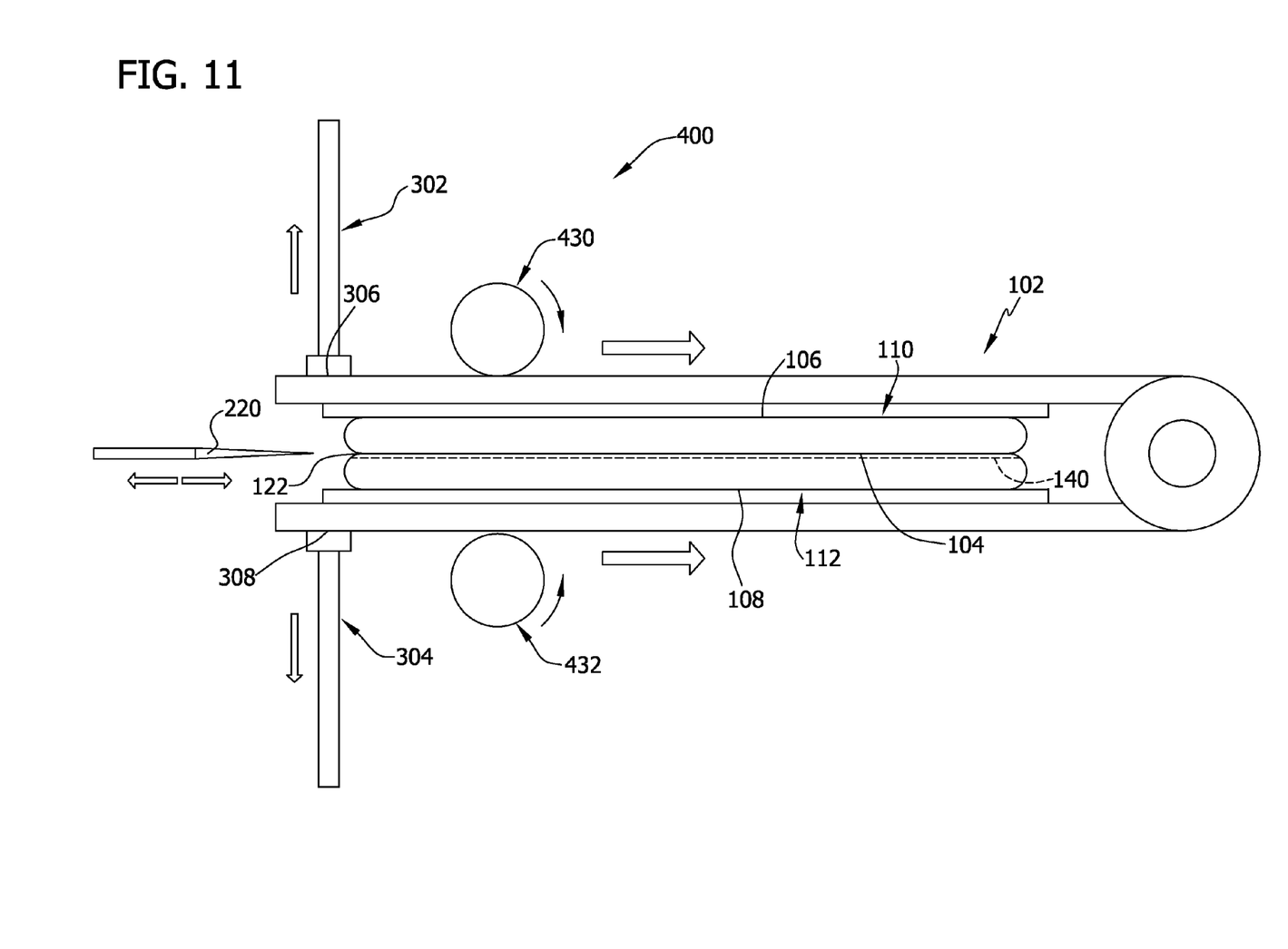
FIG. 11 is a side view of still yet another system for cleaving a bonded wafer pair in an initial state prior to cleaving the bonded wafer pair.
Figure 12:
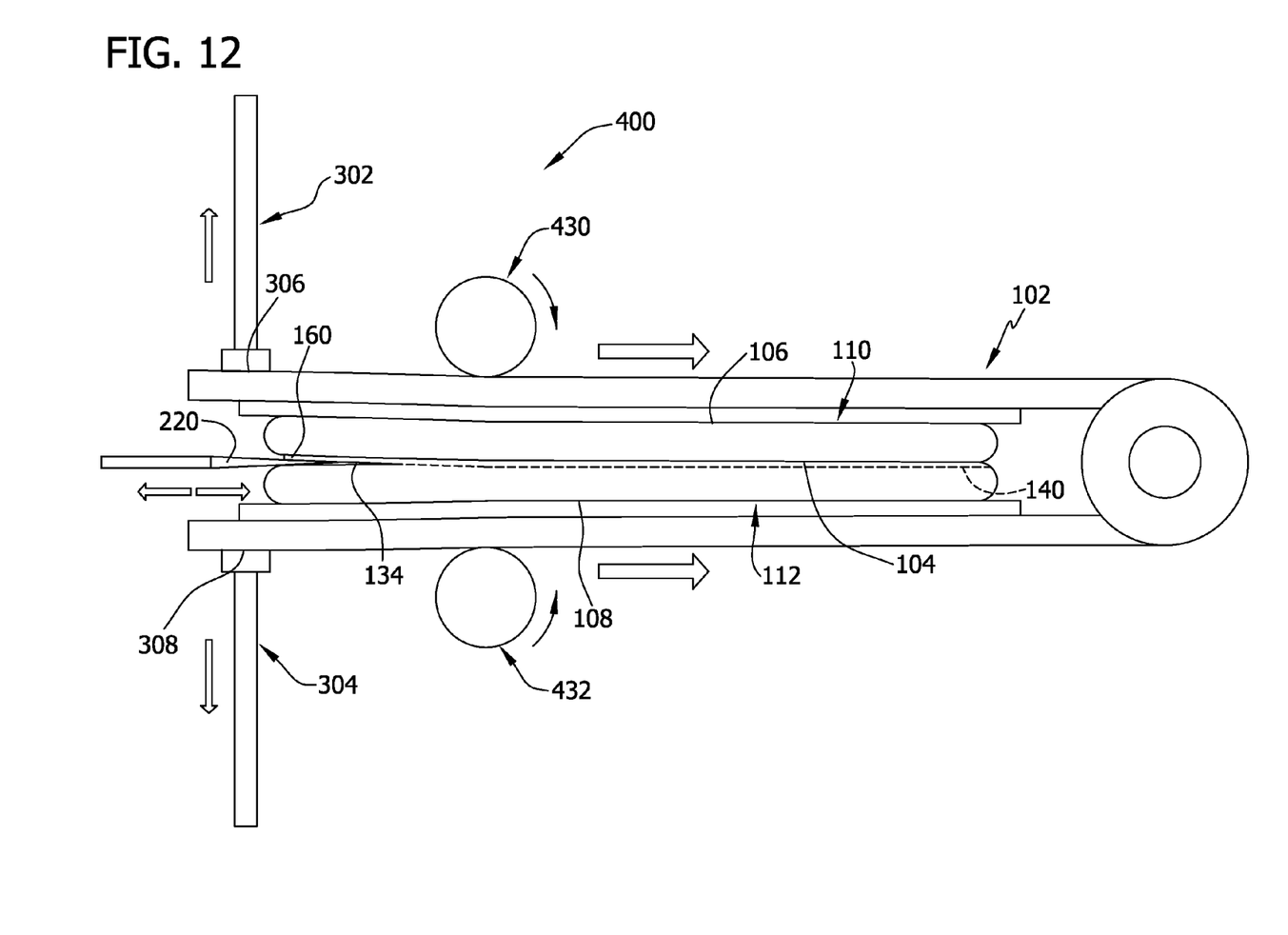
FIG. 12 is a side of the system of FIG. 11 showing the system after bonded wafer pair has been cleaved.

FIGS. 11 and 12 depict a system 400 for mechanically cleaving the bonded wafer pair 102. The bonded wafer pair 102 has features the same as, or similar to, the bonded wafer pairs described above. As such, like reference numerals are used to refer to like features on the bonded wafer pair 102 in FIGS. 11 and 12. Moreover, the system 400 has features the same as, or similar to, the system 300 described above. As such, like reference numerals are used to refer to like features in the system 400 in FIGS. 11 and 12.

The system 400 has an upper roller 430 (generally, a first roller) positioned adjacent and laterally to the right of the upper actuator 302, as shown in FIGS. 11 and 12. A lower roller 432 (generally, a second roller) is positioned adjacent and laterally to the right of the lower actuator 304. The rollers 430, 432 are in physical contact with and exert force on the respective surfaces 332, 352 of the flexible plates 320, 340. The rollers 430, 432 are in turn connected to actuators (not shown) or other suitable mechanisms to move the rollers laterally along the respective surfaces 332, 352.

The rollers 430, 432 are suitably constructed from any material that is resistant to deformation. Moreover, the rollers 430, 432 may be coated with a material that prevents the rollers from abrading or contaminating the surfaces 332, 352, such as polytetrafluoroethylene (PTFE).

In operation, the system 400 functions the same or similar to the system 300. However, as the blade 220 is moved laterally to the right during cleaving, the rollers 430, 432 are likewise moved laterally to the right while the actuators 302, 304 pull apart the flexible chucks 320, 340 and respective layers 110, 112. The position of the rollers 430, 432 with respect to the surfaces 332, 352 controls the propagation of the cleave along the cleave plane 140 in the bonded wafer pair 102. As shown in FIGS. 11 and 12, the rollers 430, 432 prevent the cleave from propagating between the rollers and to the right of the rollers. When the rollers 430, 432 move to the right, the cleave can continue to propagate. The rollers 430, 432 continue to be moved laterally to the right and the cleave continues to propagate until the entire handle wafer 110 has been cleaved from the donor wafer 112. As described above, cleaving causes the layer 160 of silicon to be transferred from the donor wafer 112 to the handle wafer 110, resulting in the creation of an SOI wafer.

Without being bound to any particular theory, it is believed that a non-constant rate of propagation of the cleave in prior art systems caused non-uniform thickness and/or roughness variations in the transferred layers of SOI wafers. The embodiments described in the systems 300, 400 reduce or eliminate this cause of non-uniform thickness and/or roughness variations on the layer 160. These embodiments also enable better control of the rate of propagation of the cleave along the cleave plane 140 so that the thickness and/or roughness of the layer 160 may be manipulated. The flexible chucks 320, 340 used in the systems 300, 400 also reduce or eliminate curved cleave marks formed in the transferred layers of SOI wafers cleaved in prior art systems. Moreover, the displacement of the actuators 302, 304 and the rate of change of the displacement can be controlled by a suitable control system. This control of the displacement and rate of change thereof controls the rate of propagation of the cleave along the cleave plane 140.

When introducing elements of the present invention or the embodiment(s) thereof, the articles "a", "an", "the" and "said" are intended to mean that there are one or more of the elements. The terms "comprising", "including" and "having" are intended to be inclusive and mean that there may be additional elements other than the listed elements. The use of terms indicating a particular orientation (e.g., "top", "bottom", "side", etc.) is for convenience of description and does not require any particular orientation of the item described.

As various changes could be made in the above constructions and methods without departing from the scope of the invention, it is intended that all matter contained in the above description and shown in the accompanying drawing[s] shall be interpreted as illustrative and not in a limiting sense.

What is claimed is:

1. A system for cleaving a bonded wafer pair having a first face and a second face, the system comprising:
   a flexible chuck comprising a flexible plate and a flexible wafer support having a first surface for attachment to the first face of the wafer pair and an opposing second surface for attachment to a first surface of the flexible plate; and
   an actuator attached to the flexible chuck for application of force on the flexible chuck, the application of force on the flexible chuck causing the cleaving of the bonded wafer pair.

2. The system of claim 1 wherein the actuator is attached to the flexible chuck with adhesive.

3. The system of claim 1 wherein the actuator is selectively attachable to the flexible chuck using vacuum.

4. The system of claim 1 in combination with the bonded wafer pair, wherein the flexible chuck has a stiffness less than or equal to a stiffness of the bonded wafer pair.

5. The system of claim 1 wherein the flexible chuck is a first flexible chuck and the system further comprises a second flexible chuck connected to the second face of the wafer pair.

6. The system of claim 5 wherein the actuator is a first actuator and the system further comprises a second actuator connected to the second flexible chuck for application of force to the second face.

7. A system for cleaving a bonded wafer pair having a first face and a second face, the system comprising:
   a first flexible chuck for attachment to the first face of the wafer pair;
   a second flexible chuck for attachment to the second face of the wafer pair;
   an actuator for attachment to the first flexible chuck;
   a movable roller positionable adjacent the actuator for application of force on the first flexible chuck and movable along the first flexible chuck,
   wherein the position of the roller controls the propagation of the cleave of the bonded wafer pair.

8. The system of claim 7 wherein the actuator is attached to the first flexible chuck with adhesive.

9. The system of claim 7 wherein the actuator is selectively attachable to the first flexible chuck using vacuum.

10. The system of claim 7 further comprising a blade for insertion between layers of the bonded wafer pair to initiate cleaving of the bonded wafer pair.

11. The system of claim 7 wherein the actuator is a first actuator and the system further comprises a second actuator connected to the second flexible chuck for application of force to the second face.

12. The system of claim 11 wherein the movable roller is a first movable roller and the system further comprises a second movable roller positioned adjacent the second actuator for application of force on the second flexible chuck and movable along the second flexible chuck.

13. A system for cleaving a bonded wafer pair having a first face and a second face, the system comprising:
   a first flexible chuck for attachment to the first face of the wafer pair;
   a second flexible chuck for attachment to the second face of the wafer pair;
   a first vacuum attachment for attachment to the first flexible chuck;
   a second vacuum attachment for attachment to the second flexible chuck;
   a movable first roller positionable adjacent the first vacuum attachment for application of force on the first flexible chuck and movable along the first flexible chuck; and a movable second roller positionable adjacent the second vacuum attachment for application of force on the second flexible chuck and movable along the second flexible chuck, wherein the position of the first and second rollers controls the propagation of the cleave of the wafer pair.

14. The system of claim 13 further comprising a blade for insertion between layers of the bonded wafer pair to initiate cleaving of the bonded wafer pair.

15. The system of claim 13 wherein an upward force is applied to the first face of the bonded wafer pair by the first vacuum attachment.

16. The system of claim 15 wherein a downward force is applied to the second face of the bonded wafer pair by the second vacuum attachment.

17. A method of cleaving a bonded wafer pair having a first face and a second face, the method comprising:

providing a flexible chuck including a flexible plate and a flexible wafer support having a first surface and an opposing second surface for attachment to a first surface of the flexible plate;

attaching the first surface of the flexible wafer support to the first face of the wafer pair;

attaching an actuator to the flexible chuck;

applying force on the flexible chuck and the first face of the wafer with the actuator to separate layers of the bonded wafer pair and cleave the bonded wafer pair.

18. The method of claim 17 wherein the actuator is attached to the flexible chuck with vacuum.

19. The method of claim 17 further comprising inserting a blade between layers of the bonded wafer pair to initiate cleaving of the bonded wafer pair.

20. The method of claim 17 further comprising positioning a movable roller adjacent the actuator and applying force on the flexible chuck with the movable roller.

21. The method of claim 20 further comprising controlling the propagation of the cleave of the wafer pair by moving the roller.

* * * * *